United States Patent
Miura et al.

(10) Patent No.: US 8,356,887 B2
(45) Date of Patent: Jan. 22, 2013

(54) PIEZOELECTRIC ELEMENT, AND LIQUID EJECTION HEAD AND RECORDING APPARATUS USING THE PIEZOELECTRIC ELEMENT

(75) Inventors: Kaoru Miura, Matsudo (JP); Tatsuo Furuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 178 days.

(21) Appl. No.: 12/717,821

(22) Filed: Mar. 4, 2010

(65) Prior Publication Data

US 2010/0225709 A1    Sep. 9, 2010

(30) Foreign Application Priority Data

Mar. 9, 2009    (JP) ................................. 2009-055722

(51) Int. Cl.
    *B41J 2/045* (2006.01)
(52) U.S. Cl. .................. 347/68; 347/70; 347/71; 347/72
(58) Field of Classification Search ............... 347/68–72
    See application file for complete search history.

(56) References Cited

U.S. PATENT DOCUMENTS

| | | | | |
|---|---|---|---|---|
| 3,059,130 A | * | 10/1962 | Robins | 310/312 |
| 4,156,158 A | * | 5/1979 | Wilson et al. | 310/369 |
| 4,211,948 A | * | 7/1980 | Smith et al. | 310/322 |
| 4,384,232 A | * | 5/1983 | Debely | 310/370 |
| RE35,011 E | * | 8/1995 | Wersing et al. | 310/334 |
| 5,761,783 A | * | 6/1998 | Osawa et al. | 29/25.35 |
| 5,814,922 A | * | 9/1998 | Uchino et al. | 310/359 |
| 5,834,880 A | * | 11/1998 | Venkataramani et al. | 310/334 |
| 5,948,996 A | * | 9/1999 | Takeuchi et al. | 73/862.043 |
| 6,211,606 B1 | * | 4/2001 | Kanda et al. | 310/328 |
| 6,653,762 B2 | * | 11/2003 | Takeshima | 310/340 |
| 6,960,868 B2 | * | 11/2005 | Ishimasa et al. | 310/324 |
| 7,288,877 B2 | * | 10/2007 | Kita et al. | 310/359 |

FOREIGN PATENT DOCUMENTS

JP    2000-246888 A    9/2000

OTHER PUBLICATIONS

Zhu, Wenyi, et al. Proceedings of the 13th US-Japan Seminar on Dielectric and Piezoelectric Ceramics, pp. 81 to 84 (2007).

* cited by examiner

*Primary Examiner* — Matthew Luu
*Assistant Examiner* — Henok Legesse
(74) *Attorney, Agent, or Firm* — Canon USA, Inc., I.P. Division

(57) ABSTRACT

Provided are a piezoelectric element that can effectively utilize a piezoelectric constant $d_{15}$ to increase a deflection displacement of a vibrating plate, and devices using the piezoelectric element. The piezoelectric element includes: a first electrode; a second electrode; a vibrating plate that is in contact with the first electrode; a piezoelectric film provided between the first electrode and the second electrode; at least one recess formed on the second electrode side of the piezoelectric film; and a third electrode formed on an inner side wall of the at least one recess, in which the third electrode is connected to the second electrode.

3 Claims, 10 Drawing Sheets

FIG. 6
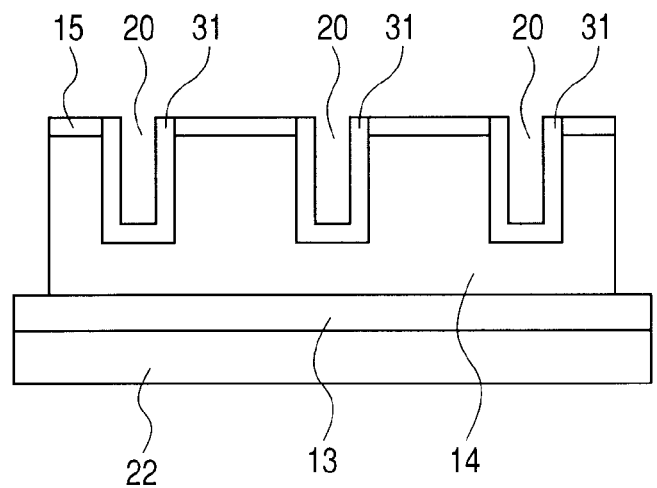
FIG. 7A    FIG. 7B    FIG. 7C
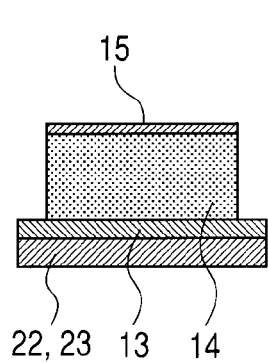 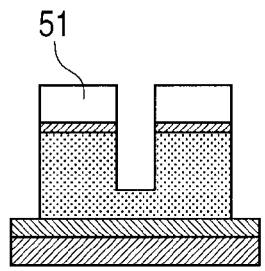 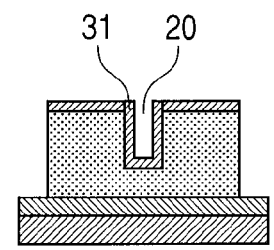

LIQUID CHAMBER
WIDTH 100 μm

PIEZOELECTRIC
FILM WIDTH 79 μm

PRIOR ART

PIEZOELECTRIC ELEMENT, AND LIQUID EJECTION HEAD AND RECORDING APPARATUS USING THE PIEZOELECTRIC ELEMENT

BACKGROUND OF THE INVENTION

1. Field of the Invention

The present invention relates to a piezoelectric element, and a liquid ejection head and a recording apparatus which use the piezoelectric element.

2. Description of the Related Art

A piezoelectric material has been employed in a wide field of a piezoelectric element also called a piezoelectric actuator, a liquid ejection head also called a piezoelectric liquid ejection head, and a recording apparatus including the liquid ejection head.

A cross section of a piezoelectric element also called a unimorph piezoelectric element (hereinafter, simply referred to as "piezoelectric element") is configured, for example, in FIG. 12. In the piezoelectric element, a piezoelectric layer 14 is disposed between a first electrode 13 also called a lower electrode and a second electrode 15 also called an upper electrode, and joined to a vibrating plate 22. In the piezoelectric element, the vibrating plate 22 is deflected and displaced by driving called unimorph driving. FIG. 13 is a schematic diagram for explaining a deflection displacement of the vibrating plate 22 by the unimorph driving. As illustrated in FIG. 13, the magnitude of deflection displacement is determined according to a sum of contributions to two kinds of displacements developed when an external electric field is applied in a direction perpendicular to the vibrating plate 22. The contributions to two kinds of displacements include one contribution to the displacement resulting from crystal strain occurring in the same direction as that of the external electric field, and the other contribution to the displacement occurring in the same direction as that of the external electric field resulting from crystal strain occurring in a direction perpendicular to the external electric field.

In the contributions to the two kinds of displacements, the former is closely related to a piezoelectric constant of $d_{33}$, and the latter is closely related to a piezoelectric constant $d_{31}$.

Furthermore, $d_{15}$ is exemplified as the piezoelectric constant in addition to the above $d_{33}$ and $d_{31}$. For example, for $PbZr_{0.55}Ti_{0.45}O_3$ as one of lead zirconate titanate (PZT: $PbZr_{1-x}Ti_xO_3$), values for $d_{33}$, $d_{31}$, and $d_{15}$ are $d_{33}=147$, $d_{31}=-57.3$, and $d_{15}=399$ ($\times 10^{-12}$ C/N). In addition, for barium titanate ($BaTiO_3$), the values are $d_{33}=191$, $d_{31}=-79$, and $d_{15}=293$ ($\times 10^{-12}$ C/N).

FIG. 14 is a diagram illustrating a relationship of the piezoelectric constants $d_{33}$, $d_{31}$, and $d_{15}$, the external electric field, the crystal strain, and the crystal displacement. As illustrated in FIG. 14, $d_{15}$ is the piezoelectric constant that is related to a so-called shear strain, and closely related to a displacement developed when crystal strain occurs in the direction of electric field on one plane of the piezoelectric layer which is parallel to the external electric field.

In the piezoelectric element, there is a case in which the vibrating plate cannot be sufficiently displaced by only the deflection displacement as in the related art. This is because an absolute value of the piezoelectric constant is a value as extremely small as the order of about $10^{-12}$ C/N. In this case, for example, in the piezoelectric liquid ejection head including the unimorph piezoelectric element, there is a fear that liquid cannot be ejected from a liquid chamber.

In view of the above-mentioned circumstances, there is easily expected that it is important to obtain the large deflection displacement of the vibrating plate through some method.

Among methods of increasing the deflection displacement of the vibrating plate, there is a method involving devising the cross section structure of the piezoelectric element. For example, Japanese Patent Application Laid-Open No. 2000-246888 discloses a liquid ejection head having a convex cross section structure in a width direction of the piezoelectric layer so that neutral planes at both ends may be moved down in the vibrating plate direction to allow an increase in the displacement of the vibrating plate. Furthermore, W. Zhu, N. Li, J. Fu and L. E. Cross, "Proceedings of the 13th US-Japan Seminar on Dielectric and Piezoelectric Ceramics, pp. 81 to 84 (2007)" discloses a piezoelectric element having a lattice structure of a substantially trapezoidal shape in cross section of the piezoelectric layer so as to increase the displacement of the vibrating plate.

However, both of the methods disclosed in the above-mentioned two documents mainly allow $d_{31}$ to efficiently contribute to the displacement of the vibrating plate, and are suitable for a structure of the piezoelectric element in which only the piezoelectric constants of $d_{31}$ and $d_{33}$ are utilized.

As described above, in the piezoelectric material including PZT and $BaTiO_3$, the absolute value of $d_{15}$ is frequently larger than the absolute values of $d_{31}$ and $d_{33}$. Accordingly, it is desirable to propose a piezoelectric element that effectively utilizes $d_{15}$.

SUMMARY OF THE INVENTION

The present invention has been made in view of the above-mentioned circumstances, and therefore an object of the present invention is to provide a piezoelectric element that effectively utilizes a piezoelectric constant $d_{15}$ so as to increase a deflection displacement of a vibrating plate. It is another object of the present invention is to provide a liquid ejection head and a recording apparatus using the above-mentioned piezoelectric element.

In order to solve the above-mentioned problem, a piezoelectric element according to the present invention includes a first electrode, a second electrode, a vibrating plate that is in contact with the first electrode, a piezoelectric film formed between the first electrode and the second electrode; at least one recess formed on the second electrode side of the piezoelectric film, and a third electrode formed on an inner side wall of the at least one recess, in which the third electrode is connected to the second electrode.

According to the present invention, the piezoelectric element that effectively utilizes the piezoelectric constant $d_{15}$ to increase the deflection displacement of the vibrating plate can be provided.

Furthermore, the liquid ejection head and the recording apparatus using the above-mentioned piezoelectric element can be provided.

Further features of the present invention will become apparent from the following description of exemplary embodiments with reference to the attached drawings.

BRIEF DESCRIPTION OF THE DRAWINGS

FIG. 6 is a cross-sectional view illustrating a piezoelectric element according to Example 1 of the present invention.

FIGS. 7A, 7B and 7C are explanatory diagrams illustrating a method of producing the piezoelectric element according to Example 1 of the present invention.

DETAILED DESCRIPTION OF THE EMBODIMENTS

A piezoelectric element of the present invention effectively utilizes a piezoelectric constant $d_{15}$ so as to increase a deflection displacement of a vibrating plate.

That is, the piezoelectric element according to the present invention includes: a first electrode, a second electrode, a vibrating plate stacked on the first electrode, a piezoelectric film formed between the first electrode and the second electrode, at least one recess formed in the piezoelectric film on a side of the second electrode; and a third electrode formed on an inner side wall of the at least one recess, in which the third electrode is connected to the second electrode.

Furthermore, the present invention provides a liquid ejection head and a recording apparatus using the above-mentioned piezoelectric element.

That is, the liquid ejection head includes: an individual liquid chamber that communicates with an ejection orifice which ejects liquid; and the above-mentioned piezoelectric element, which is provided in correspondence to the individual liquid chamber.

The recording apparatus according to the present invention includes the above-mentioned liquid ejection head, which ejects liquid.

In the following examples, the piezoelectric element according to the present invention, and the liquid ejection head and the recording apparatus using the above-mentioned piezoelectric element are described in detail.

EXAMPLES

Example 1

An example of a piezoelectric element as Example 1 of the present invention is described with reference to FIGS. 1 to 7C.

Figure 1:
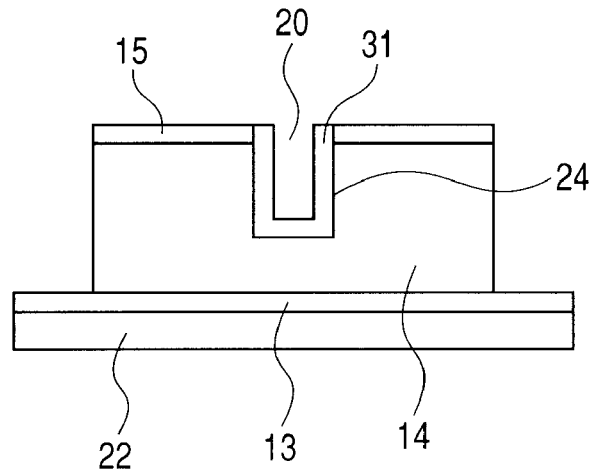
FIG. 1 is a cross-sectional view illustrating a piezoelectric element according to Example 1 of the present invention.

FIG. 1 is a cross-sectional view illustrating the piezoelectric element according to Example 1 of the present invention. Referring to FIG. 1, the piezoelectric element according to the present invention includes a first electrode 13, a second electrode 15, a vibrating plate 22, and a piezoelectric film 14. The piezoelectric film 14 is disposed between the first electrode 13 and the second electrode 15 opposed to each other. The vibrating plate 22 is disposed outside the first electrode 13.

At least one recess 20 is formed on the second electrode side of the piezoelectric film 14. A third electrode 31 is formed on an inner side wall 24 of the recess 20, and the third electrode 31 is connected to the second electrode 15.

Figure 2:
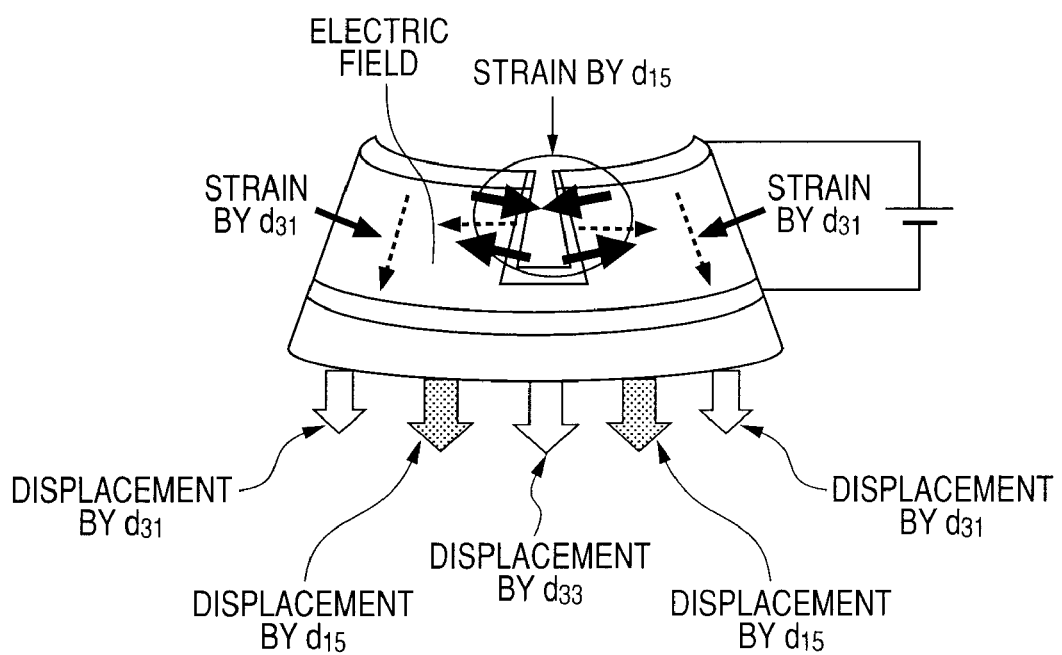
FIG. 2 is a schematic diagram illustrating an operation of a cross section of the piezoelectric element according to Example 1 of the present invention.

A deflection displacement of the vibrating plate in the piezoelectric element illustrated in FIG. 1 operates as illustrated in a schematic diagram of FIG. 2. The displacements based on piezoelectric constants $d_{33}$ and $d_{31}$ contribute to the deflection displacement of the vibrating plate 22 due to an electric field generated between the first electrode 13 and the second electrode 15 in the longitudinal direction of FIG. 2. The displacement based on a piezoelectric constant $d_{15}$ also contributes to the deflection displacement of the vibrating plate 22 due to the electric field in the lateral direction of FIG. 2, which is generated in the vicinity of the third electrode 31. Accordingly, in the piezoelectric element of this example illustrated in FIG. 1, the amount of deflection displacement of the vibrating plate is increased more than in the conventional piezoelectric element illustrated in FIG. 12.

In order to bear out the effect of this example, simulation results using a finite element method are described below. The simulation results were obtained by using a finite element method package software "ANSYS" (ANSYS Inc.).

The simulation was conducted on the following four kinds of structures.

Figure 12:
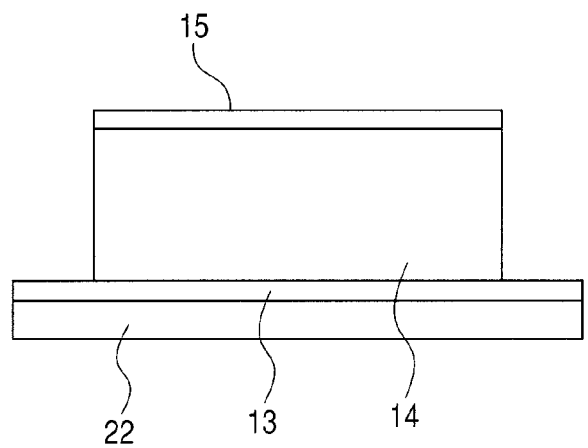
FIG. 12 is a cross-sectional view illustrating a conventional piezoelectric element.
Figure 13:
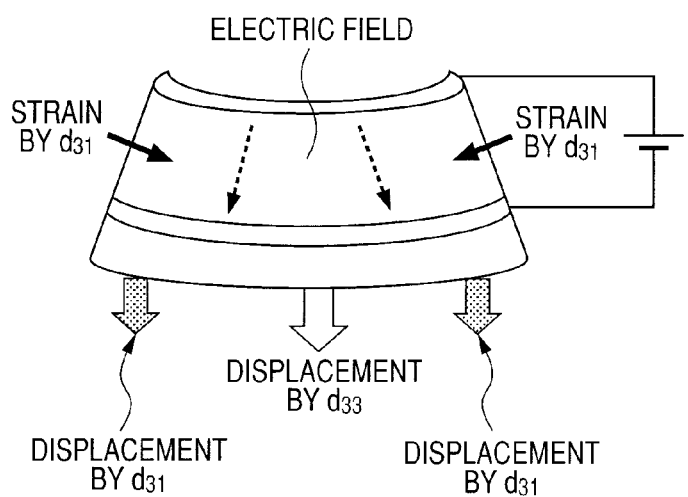
FIG. 13 is a schematic diagram illustrating an operation of a cross section of the conventional piezoelectric element.
Figure 14:
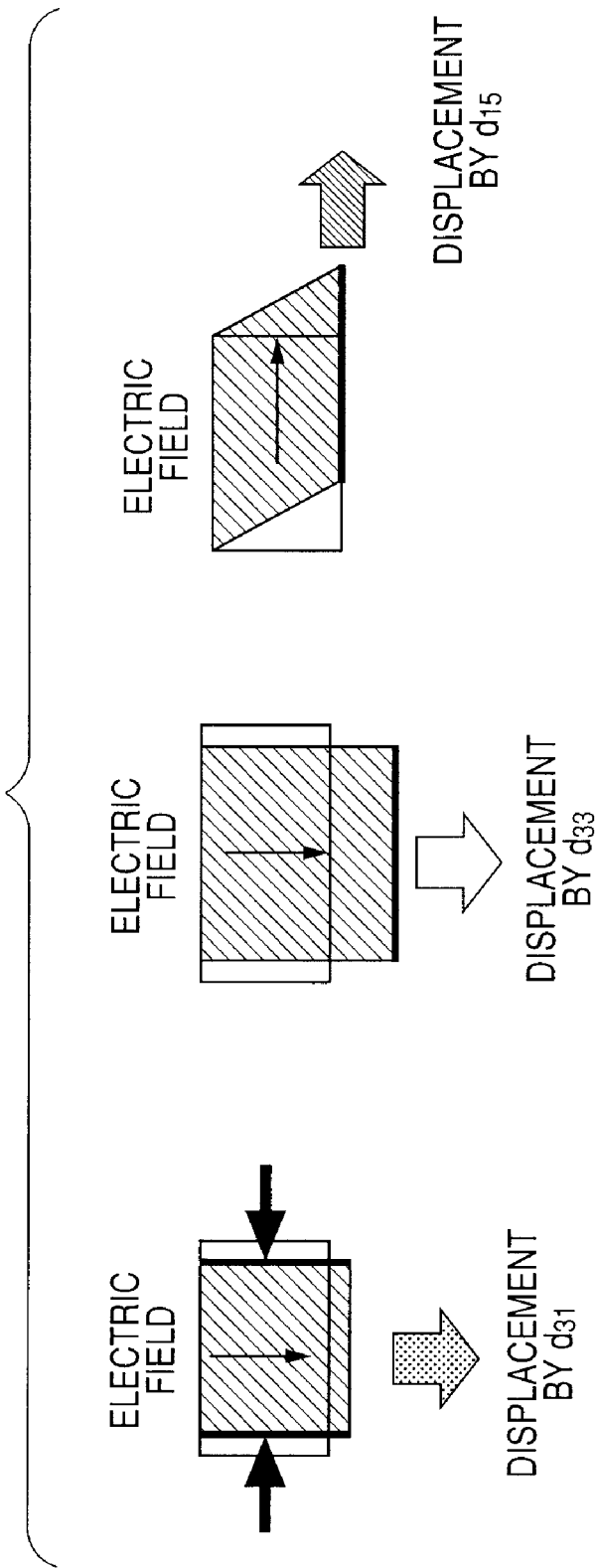
FIG. 14 is a schematic diagram illustrating definition of various piezoelectric constants.

(a) A structure (FIG. 3A) of the related art illustrated in FIG. 12. It is assumed that the vibrating plate 22 is made of silicon (Si), and a thickness of the vibrating plate 22 is 4.5 μm. After a silicon oxide ($SiO_2$) film 23 having a thickness of 1 μm has been formed, the first electrode 13 made of platinum (Pt) and having a thickness of 0.3 μm, the piezoelectric film 14 having a thickness of 3.0 μm, and the second electrode 15 made of platinum (Pt) and having a thickness of 0.3 μm were formed on the silicon oxide film 23. The widths of the vibrating plate 22 and the $SiO_2$ film 23 were set to 100 μm, and the widths of the piezoelectric film 14 and the second electrode 15 were set to 79 μm. The lengths of those films in the depth direction were set to 2,000 μm.

(b) A structure (FIG. 3B) in which only a recess is formed. A recess that was 0.4 μm in width and 1.7 μm in depth was formed in the structure of FIG. 3A. The recess has the same size as that of a recess of FIG. 3D described below.

Figure 3A:
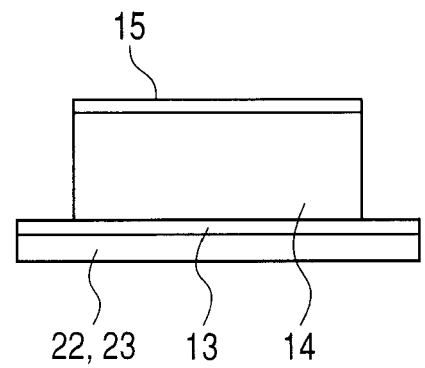
FIGS. 3A, 3B, 3C and 3D are cross-sectional views illustrating the piezoelectric element according to Example of the present invention and a comparative example, respectively.
Figure 3B:
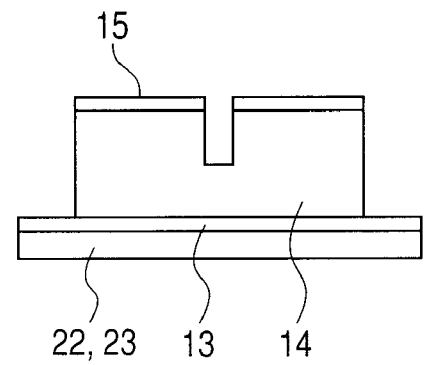

(c) A structure (FIG. 3C) in which only a recess is formed, and the size of the recess is different from that of FIG. 3B. A recess that was 1 μm in width and 2 μm in depth was formed in the structure of FIG. 3A.

(d) The structure (FIG. 3D) of this example illustrated in FIG. 1. The third electrode 31 that was 0.3 μm in thickness was formed on the inner side wall and the bottom of the recess in the structure of FIG. 3C.

The piezoelectric film 14 was made of $PbZr_{0.55}Ti_{0.45}O_3$, and the piezoelectric constants of $d_{33}=147$, $d_{31}=-57.3$, and $d_{15}=399$ ($\times 10^{-12}$ C/N) were used. As a result of applying voltage of 0 V to the first electrode 13, and voltage of 30 V to the second electrode 15 and the third electrode 31, values shown in the following Table 1 were obtained as the amount of displacement of the vibrating plate 22.

TABLE 1

Figure 3C:
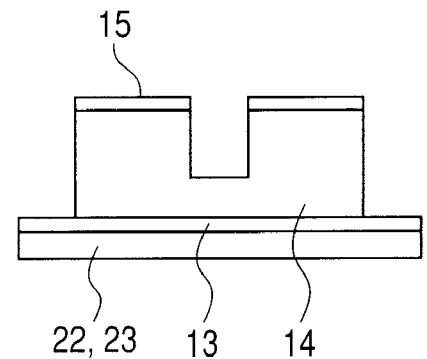
Figure 3D:
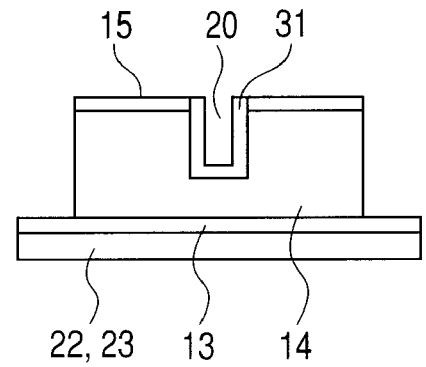

| Structural diagram | The amount (nm) of displacement of the vibrating plate |
|---|---|
| FIG. 3A | 74.0 |
| FIG. 3B | 72.0 |
| FIG. 3C | 68.8 |
| FIG. 3D | 78.7 |

Figure 4A:
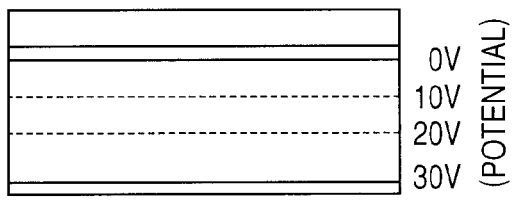
FIGS. 4A, 4B, and 4C are diagrams illustrating electric field distributions of the piezoelectric element according to Example 1 of the present invention and the comparative example, respectively.
Figure 4B:
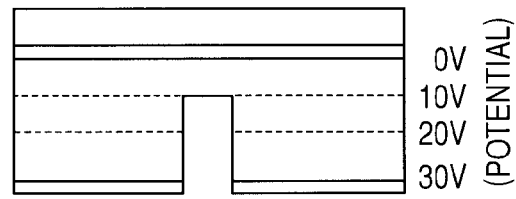
Figure 4C:
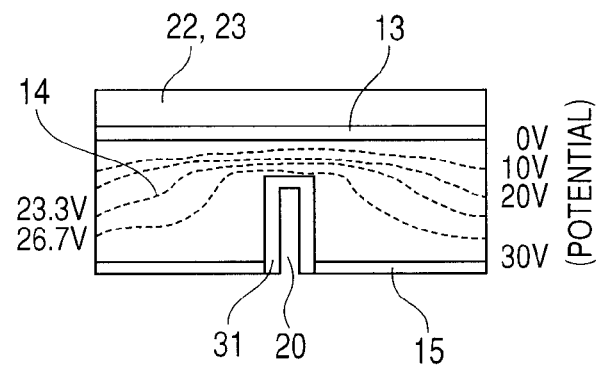

The contours of electric field distribution of FIGS. 3A, 3C, and 3D are illustrated in FIGS. 4A, 4B, and 4C, respectively.

As shown in Table 1, in the structure of this example (FIG. 3D), the amount of displacement was increased by about 6% as compared with the structure (FIG. 3A) of the related art. It was apparent from the results of FIG. 4A that an electric field in the lateral direction was generated in the vicinity of the recess. That is, the propriety of the schematic diagram of the operation illustrated in FIG. 2 was proved.

In Table 1, it was confirmed from the results of FIGS. 3B and 3C that the amount of displacement when only the recess was formed was instead decreased more than that in the structure (FIG. 3A) of the related art. Conceivably, this is caused by two reasons that a portion where the recess is formed does not contribute to the generation of electric field (FIG. 4B) so that an effective region of the piezoelectric film 14 that contributes to $d_{33}$ is decreased, and that the strain of $d_{31}$ that occurs in the vicinity of the recess operates in a direction of preventing an increase in the displacement of the vibrating plate.

Subsequently, the cross-sectional shape of the recess in the piezoelectric element according to the present invention is described.

Figure 5:
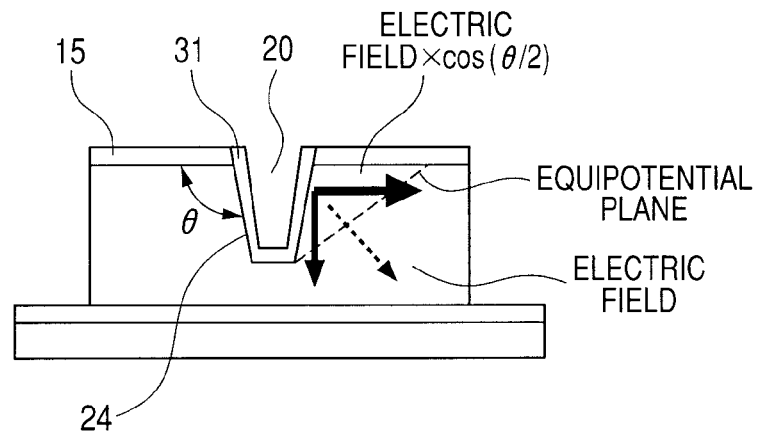
FIG. 5 is a cross-sectional view illustrating a general piezoelectric element according to Example 1 of the present invention.

FIG. 5 is a cross-sectional view illustrating the piezoelectric element according to the present invention. As illustrated in FIG. 5, it is assumed that an angle formed between a surface of the second electrode 15 and the inner side wall 24 of the recess 20 is θ. The angle θ in the cross-sectional shape of the ideal recess is 90 degrees. The equipotential plane in the piezoelectric film 14 when a voltage is applied to the second electrode 15 and the third electrode 31 is substantially parallel to the subtense of an isosceles triangle having the angle θ as a narrow angle. The electric field in the piezoelectric film 14 is generated so as to be orthogonal to the equipotential plane. Accordingly, in this example, the magnitude of the electric field related to $d_{15}$ is a product of the magnitude of the electric field and $\cos(θ/2)$, and a projection component of the electric field in the lateral direction. In this example, in order that the crystal strain related to $d_{15}$ sufficiently contribute to the deflection displacement of the vibrating plate 22, it is desirable that the electric field of at least about 50% of the above-mentioned electric field exist. That is, it is desirable that the angle θ be 120 degrees or smaller. As a result, it is desirable that the angle θ of FIG. 5 be equal to or larger than 90 degrees, and equal to or smaller than 120 degrees.

In order to sufficiently create the effect of this example, it is desirable that the depth of the recess 20 be equal to or larger than at least 50% of the thickness of the piezoelectric film 14, preferably equal to or larger than 50% and equal to or smaller than 80%. The effect of this example is sufficiently created when the recess 20 is as deep as possible. However, it is desirable from the viewpoint of the process that the recess (FIG. 3C) processed before the formation of the third electrode 31 be formed with a depth taking a margin of about 1 μm into consideration with respect to the thickness of the piezoelectric film 14.

On the other hand, it is desirable that the width of the recess 20 be smaller, for example, be equal to or smaller than 1 μm, preferably equal to or larger than 0.3 μm and equal to or smaller than 0.8 μm. This is because the width of the recess 20 involves decrease in the displacement of the vibrating plate, which is generated in the structure where only the recess is formed as illustrated in FIGS. 3B and 3C in this example. From the results of Table 1, the decrease in the displacement of the vibrating plate is reduced more when the width of the recess 20 is as small as possible.

The number of recesses in this example is described.

As illustrated in FIG. 6, in this example, the number of recesses formed on the second electrode side of the piezoelectric film is one or more, and may be plural. Furthermore, the recess may be formed not only in the cross section of the piezoelectric element in the width direction as illustrated in FIG. 6, but also in the cross section of the piezoelectric element in the longitudinal direction. That is, the recesses may be arranged in a lattice on a surface of the piezoelectric element on the second electrode side. It is necessary that the third electrode be formed on each of the inner side walls of the multiple recesses, and all of the third electrodes be connected to the common second electrode.

Next, a method of producing the piezoelectric element according to this example is described below.

FIGS. 7A to 7C are views illustrating the method of producing the piezoelectric element according to this example. First, in FIG. 7A, a substrate is prepared. The substrate to be used is formed of, for example, an Si substrate or an SOI substrate. In this example, the SOI substrate is used. With regard to the thickness of the substrate, in the SOI substrate of 200 μm in thickness, silicon (Si) is 199 μm in thickness and the $SiO_2$ film 23 is 1 μm in thickness. A rear surface of the SOI substrate is polished or patterned as occasion demands to form the vibrating plate 22 made of silicon (Si). In this example, the thickness of the vibrating plate 22 is set to, for example, 4.5 μm. After that, for example, the first electrode 13 made of platinum (Pt) with a thickness of 0.3 μm, the piezoelectric film 14 with a thickness of 3.0 μm, and the second electrode 15 made of platinum (Pt) with a thickness of 0.3 μm are formed on the vibrating plate 22. As a method of forming the first electrode 13, the piezoelectric film 14, and the second electrode 15, a known film forming method such as sputtering, a laser abrasion method, or a metal organic chemical vapor deposition (MOCVD) method is used. Through the above-mentioned process, the structure of FIG. 7A is formed. The $SiO_2$ film 23 exists for the purpose of improving adhesion between the vibrating plate 22 and the first electrode 13. However, the $SiO_2$ film is not always required.

Then, as illustrated in FIG. 7B, the piezoelectric film 14 and the second electrode 15 are patterned. The patterning is conducted by, for example, chemical etching or ion milling. FIG. 7B is a view illustrating a patterning process using the chemical etching, which illustrates a state immediately after a resist 51 is coated and the chemical etching is conducted. After that, the resist 51 is removed.

After that, the third electrode 31 is formed through a known film forming method such as sputtering, a laser abrasion method, or an MOCVD method. Through the above-mentioned process, the piezoelectric element illustrated in FIG. 7C is obtained.

As a piezoelectric material of the piezoelectric film 14, for example, zirconate titanate (PZT), barium titanate, or the like is used.

Example 2

Subsequently, an example of a liquid ejection head as Example 2 is described with reference to FIGS. 8 to 10B.

The liquid ejection head includes individual liquid chambers 16 that each communicate with an ejection orifice 21 that ejects liquid, and a piezoelectric element of the present invention, which is disposed in correspondence with each of the individual liquid chambers.

Figure 8:
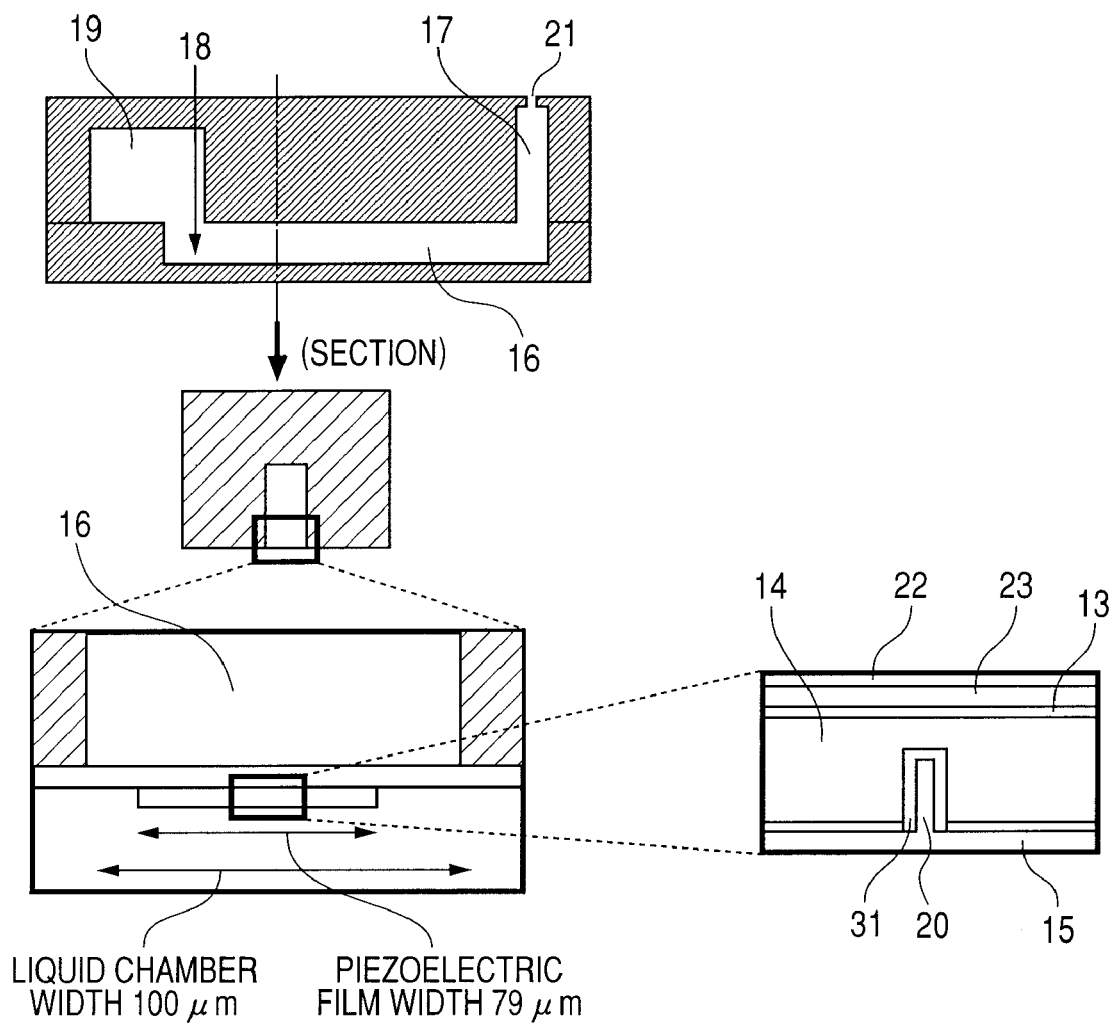
FIG. 8 is a structural diagram illustrating a liquid ejection head according to Example 2 of the present invention.

FIG. 8 is a cross-sectional view illustrating a three-dimensional conformation of the liquid ejection head in which the piezoelectric element according to Example 1 of the present invention is installed. The piezoelectric element according to Example 1 is formed at a lower portion of each of the individual liquid chambers 16 that communicate with a common liquid chamber 19 through supply ports 18.

Figure 9A:
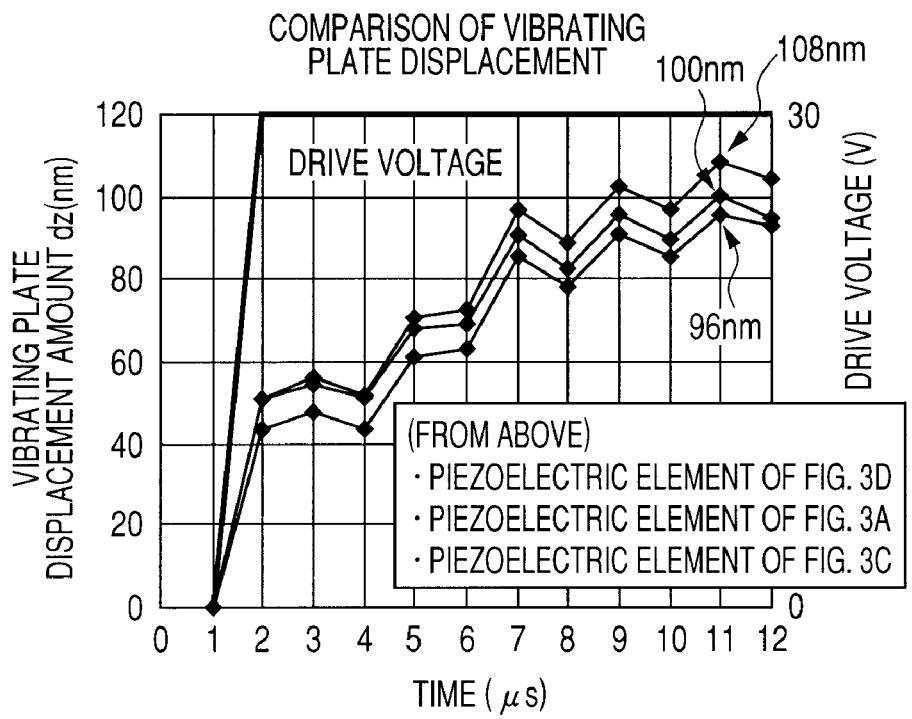
FIGS. 9A and 9B are comparative diagrams illustrating characteristics of the liquid ejection head according to Example 2 of the present invention, and a comparative example.
Figure 9B:
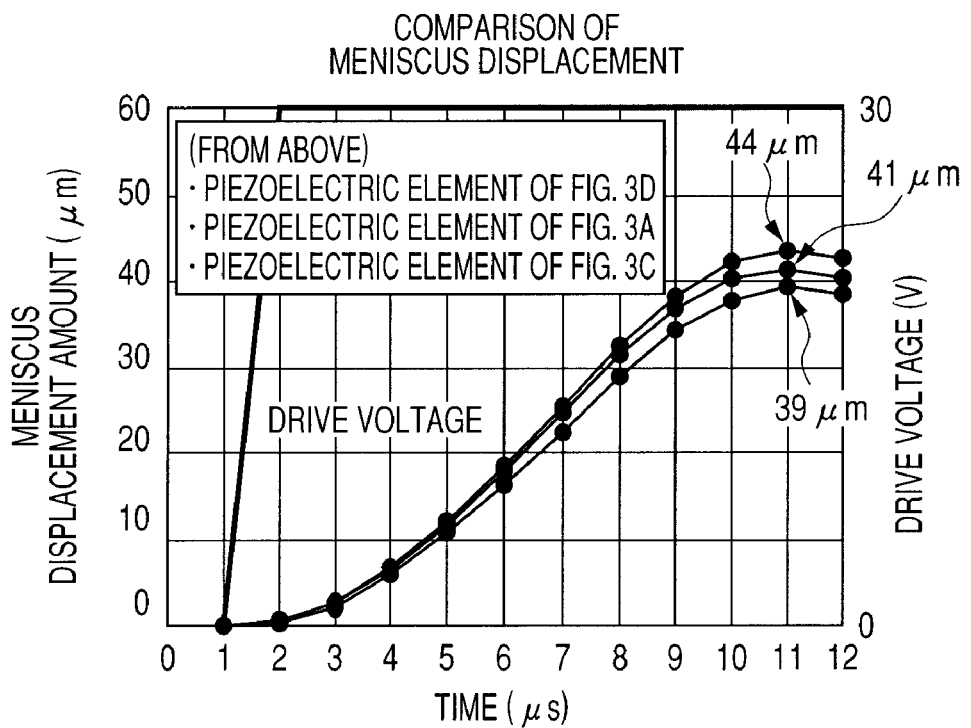

FIGS. 9A and 9B illustrate temporal changes in the displacement of the vibrating plate and the displacement of meniscus when a voltage is applied to the liquid ejection head of FIG. 8. The meniscus means embossment of liquid that is about to be ejected from the ejection orifice 21. As illustrated in FIGS. 9A and 9B, in the piezoelectric element according to Example 1, it is confirmed that the amount of displacement becomes maximum, the displacement of the vibrating plate increases by 8%, and the displacement of meniscus increases by about 7%.

Figure 10A:
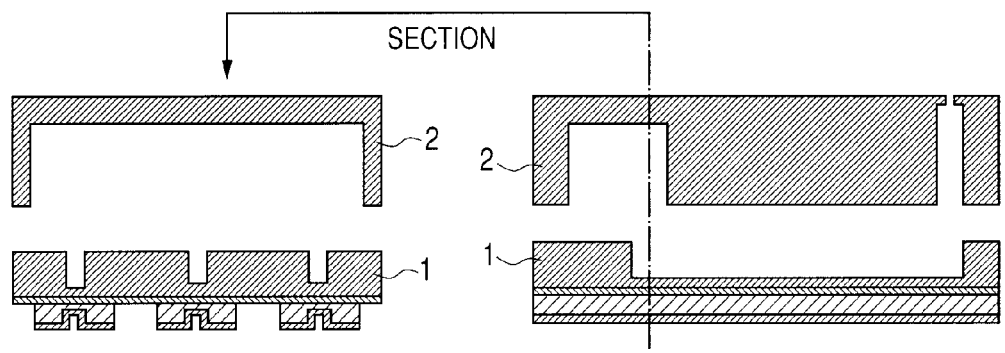
FIGS. 10A and 10B are explanatory diagrams illustrating a method of producing the liquid ejection head according to Example 2 of the present invention.
Figure 10B:
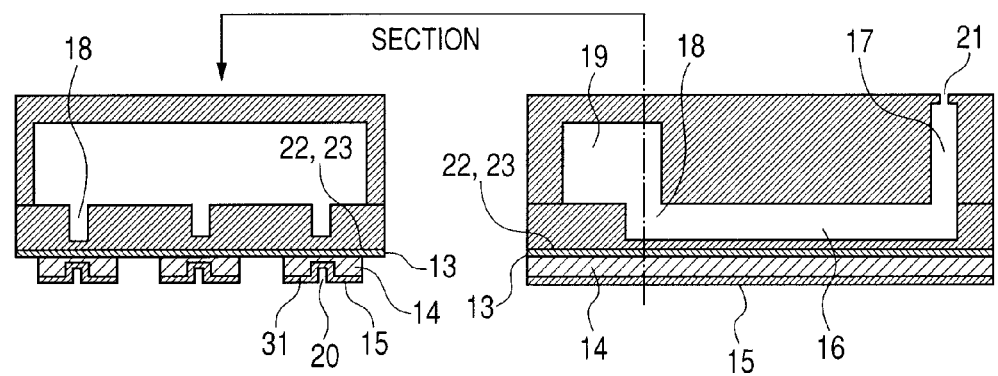

FIGS. 10A and 10B are cross-sectional views illustrating the cross section of the liquid ejection head illustrated in FIG. 8, respectively. A structure of the entire liquid ejection head using the piezoelectric element of this example and a production method therefor are described with reference to FIGS. 10A and 10B.

First, a substrate 1 and a substrate 2 are prepared as illustrated in FIG. 10A.

After the piezoelectric element has been formed, the substrate 1 is patterned into the individual liquid chambers 16 that are 100 μm in width, 200 μm in height, and 6,000 μm in depth, and the supply ports 18 that are 30 μm in width, 200 μm in height, and 220 μm in depth, for example. The patterning is conducted by, for example, chemical etching or ion milling, and thereafter flattened.

Then, the patterning substrate 2 is prepared. The substrate 2 is formed of, for example, an Si substrate or an SOI substrate. From the viewpoint of a subsequent patterning process, it is desirable to use the SOI substrate. Furthermore, with regard to the thickness of the substrate 2, for example, in the SOI substrate of 400 μm in thickness, the thickness of silicon (Si) is 399 μm, and the thickness of silicon oxide ($SiO_2$) is 1 μm.

Then, the substrate 2 is patterned. For example, the substrate 2 is patterned into the common liquid chamber 19 that is 150 μm in height and 800 μm in depth, an orifice communication portion 17 that is 60 μm in diameter and 350 μm in height, and the ejection orifice 21 that is 30 μm in diameter and 50 μm in height. The patterning is conducted by chemical etching or ion milling. After the patterning, the substrate 2 is flattened.

Finally, as illustrated in FIG. 10B, the substrate 1 and the substrate 2 are bonded together. The bonding is conducted by, for example, gold (Au) to gold (Au) joint. Through the process, the substrate 1 and the substrate 2 are integrated together.

Through the above-mentioned process, the liquid ejection head illustrated in FIG. 8 is formed. As illustrated in FIGS. 9A and 9B, the liquid ejection head has a performance of obtaining a large displacement in both of the displacement of the vibrating plate and the displacement of the meniscus.

Example 3

Subsequently, an example of a recording apparatus as Example 3 is described with reference to FIG. 11.

Figure 11:
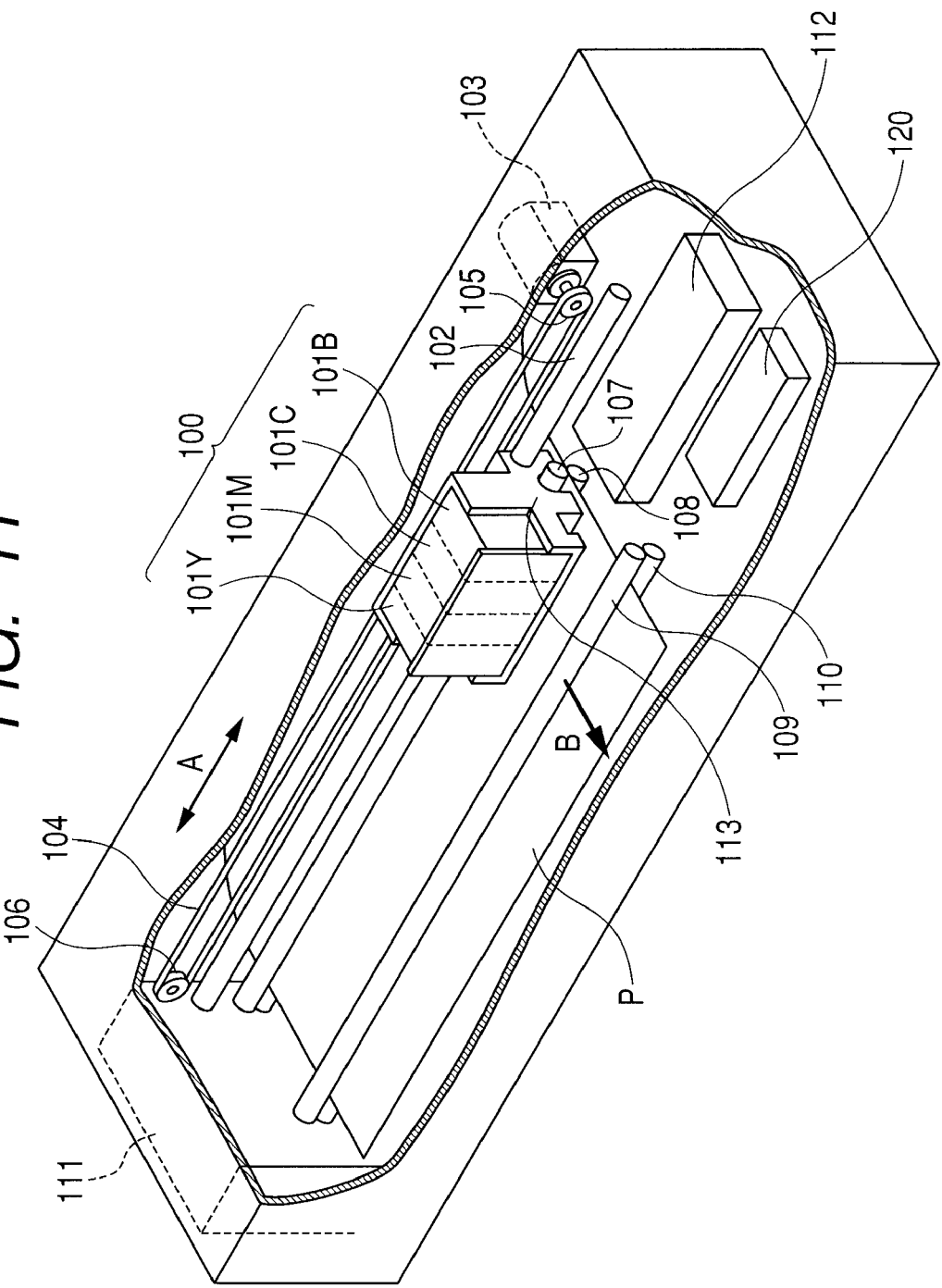
FIG. 11 is a perspective view illustrating a recording apparatus according to Example 3 of the present invention.

FIG. 11 is a perspective view of the recording apparatus according to the present invention. In FIG. 11, the recording apparatus includes a liquid ejection head unit 100, an ink tank 101, a guide shaft 102, a medium to be recorded 106, a guide shaft 107, a feed roller 109, a feed roller 110, a recovery unit 112, a liquid ejection head 113, and a cleaning unit 120.

The recording apparatus illustrated in FIG. 11 is a liquid ejecting apparatus, and the medium to be recorded P which has been inserted into the liquid ejecting apparatus is transported to a recordable region of the liquid ejection head unit 100 by the feed rollers 109 and 110. The liquid ejection head unit 100 is guided movably along an extending direction (main scanning direction) of the two guide shafts 102 and 107 by those guide shafts 102 and 107, and reciprocatingly scans the recording region. In this example, the scanning direction of the liquid ejection head unit 100 is the main scanning direction, and the transporting direction of the medium to be recorded P is a sub-scanning direction. The liquid ejection head 113 illustrated in FIG. 8 and the ink tank 101 for supplying ink to the common liquid chamber 19 are installed in the liquid ejection head unit 100. The ink tank 101 includes, for example, ink tanks for four colors of black (Bk), cyan (C), magenta (M), and yellow (Y).

The recovery unit 112 is disposed at a lower portion of the right end of a region where the liquid ejection head unit 100 is movable, and recovers the ejection orifice portion of the recording head during non-recording operation.

In this example, the ink tanks for respective colors of Bk, C, M, and Y are configured to be exchangeable, independently. A Bk ink tank 101B, a C ink tank 101C, an M ink tank 101M, and a Y ink tank 101Y are installed in the liquid ejection head unit 100. Four units of the liquid ejection heads 113 are installed, the units are connected to the ink tanks of four colors, respectively, and the inks are supplied to the common liquid chambers 19 of the units, respectively.

Since the piezoelectric element of the present invention can effectively utilize the piezoelectric constant $d_{15}$ to increase the deflection displacement of the vibrating plate, the present invention can be utilized in the liquid ejection head and the recording apparatus using the above-mentioned piezoelectric element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-055722, filed Mar. 9, 2009, which is hereby incorporated by reference herein in its entirety.

What is claimed is:

1. A piezoelectric element, comprising:
   a first electrode;
   a second electrode;
   a vibrating plate stacked on the first electrode;
   a piezoelectric film provided between the first electrode and the second electrode;
   at least one recess formed on the second electrode side of the piezoelectric film; and
   a third electrode formed along an inner side wall of the at least one recess,
   wherein the third electrode is connected to the second electrode, and
   wherein the first electrode and the second electrode are provided in a direction intersecting a direction in which the piezoelectric film is polarized, and the third electrode is provided along the direction in which the piezoelectric film is polarized.

2. A liquid ejection head, comprising:

an individual liquid chamber communicating with an ejection orifice for ejecting liquid; and
the piezoelectric element set forth in claim 1, which is provided in correspondence to the individual liquid chamber.

3. A recording apparatus, comprising the liquid ejection head set forth in claim 2, for ejecting liquid.

* * * * *